US008836009B2

(12) United States Patent
Chin et al.

(10) Patent No.: US 8,836,009 B2
(45) Date of Patent: Sep. 16, 2014

(54) FLASH MEMORY (75) Inventors: Albert Chin, Hsinchu (TW);
Chun-Yang Tsai, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 192 days.

(21) Appl. No.: 13/308,959

(22) Filed: Dec. 1, 2011

(65) Prior Publication Data
US 2013/0140621 A1 Jun. 6, 2013

(51) Int. Cl.
H01L 29/792 (2006.01)
(52) U.S. Cl.
USPC ........... 257/324; 257/326; 257/314; 257/325; 257/365; 257/410; 257/E21.21; 257/E29.309; 257/E21.409; 257/E21.546; 257/E27.062; 438/586; 438/201; 438/268; 438/559; 438/381
(58) Field of Classification Search
CPC ............... H01L 2924/1438; H01L 21/28282; H01L 27/11563; H01L 29/4234; H01L 29/66833; H01L 29/792; H01L 29/8616
USPC ......... 257/324, 213, 287, 311, 411, 515, 325, 257/E21.21, E29.309, E21.409, E21.546, 257/E27.062, E29.264; 438/466, 585, 272, 438/287, 552, 559, 381, 515
See application file for complete search history.

(56) References Cited

U.S. PATENT DOCUMENTS

| 6,828,618 | B2 * | 12/2004 | Baker et al. | 257/311 |
| 7,105,889 | B2 * | 9/2006 | Bojarczuk et al. | 257/324 |
| 7,655,971 | B2 * | 2/2010 | Ino et al. | 257/325 |
| 7,759,747 | B2 * | 7/2010 | Forbes et al. | 257/411 |
| 7,772,072 | B2 * | 8/2010 | Wang et al. | 438/287 |
| 7,947,582 | B2 * | 5/2011 | Hautala et al. | 438/515 |
| 2007/0057292 | A1 * | 3/2007 | Park et al. | 257/213 |
| 2007/0120179 | A1 * | 5/2007 | Park et al. | 257/324 |
| 2008/0099826 | A1 * | 5/2008 | Lai et al. | 257/324 |
| 2008/0290400 | A1 * | 11/2008 | Jenne et al. | 257/324 |
| 2009/0261405 | A1 * | 10/2009 | Kim et al. | 257/324 |
| 2010/0052037 | A1 * | 3/2010 | Chin | 257/324 |
| 2011/0101442 | A1 * | 5/2011 | Ganguly et al. | 257/324 |

OTHER PUBLICATIONS

Tsai et al., "Highly-Scaled 3.6-nm ENT Trapping Layer MONOS Device with Good Retention and Endurance", IEDM Tech. Dig., pp. 110-113 (2010).

* cited by examiner

Primary Examiner — Jerome Jackson, Jr.
Assistant Examiner — Bo Fan
(74) Attorney, Agent, or Firm — Edwards Wildman Palmer LLP; Peter F. Corless; Richard B. Emmons (57) ABSTRACT A MONOS Charge-Trapping flash (CTF), with record thinnest 3.6 nm ENT trapping layer, has a large 3.1 V 10-year extrapolated retention window at 125° C. and excellent $10^6$ endurance at a fast 100 μs and ±16 V program/erase. This is achieved using $As^+$-implanted higher κ trapping layer with deep 5.1 eV work-function of As. In contrast, the un-implanted device only has a small 10-year retention window of 1.9 V at 125° C. A MoN—[SiO$_2$—LaAlO$_3$]—[Ge—HfON]—[LaAlO$_3$—SiO$_2$]—Si CTF device is also provided with record-thinnest 2.5-nm Equivalent-Si$_3$N$_4$-Thickness (ENT) trapping layer, large 4.4 V initial memory window, 3.2 V 10-year extrapolated retention window at 125° C., and 3.6 V endurance window at $10^6$ cycles, under very fast 100 μs and low ±16 V program/erase. These were achieved using Ge reaction with HfON trapping layer for better charge-trapping and retention.

11 Claims, 10 Drawing Sheets

FLASH MEMORY

BACKGROUND OF THE INVENTION

1. Field of the Invention

This invention relates to flash memories, and, more particularly, to a flash memory having a charge-trapping layer formed by implanting arsenic into ZrON.

2. Description of Related Art

According to International Technology Roadmap for Semiconductors (ITRS), the degraded endurance and retention are the toughest challenges to further down-scaling the Charge-Trapping Flash (CTF), due to the fewer electrons stored in highly scaled device. On the other hand, scaling down the $Si_3N_4$ charge-trapping layer to 3-4 nm is needed in ITRS for continuous device scaling, but no proposed solution up to now. However, this worsens the retention and endurance due to the poorer trapping capability at thinner $Si_3N_4$, where nearly no charge trapping was found in 2 nm $Si_3N_4$. Although the retention is improved by using a thicker tunnel oxide, this yields reduced erase speed. Such retention and erase-speed trade-off is a basic limitation of CTF.

Previously we addressed this limitation with a deep trapping energy $E_{vac}-E_C$ Al(Ga)N or HfON in a metal-oxide-nitride-oxide-Si (MONOS) device. The better retention of high-κ Al(Ga)N MONOS CTF was also listed in ITRS. One drawback of desired higher κ HfON is the lower trapping efficiency; thus, the double trapping HfON—$Si_3N_4$ CTF was used. Yet the scaling equivalent-$Si_3N_4$-thickness (ENT) is still limited to 7 nm.

SUMMARY OF THE INVENTION

In view of the above-mentioned problems of the prior art, it is a primary objective of the present invention to provide flash memory that has a charge-trapping layer formed by implanting arsenic into ZrON.

In an embodiment of the present invention, the flash memory includes: a substrate; a first $SiO_2$ layer formed on the substrate; a first high-κ layer formed on the first $SiO_2$ layer; a metal-implanted oxynitride layer formed on the first high-κ layer; a second high-κ layer formed on the metal-implanted oxynitride layer; a second $SiO_2$ layer formed on the second high-κ layer; and a gate layer formed on the second $SiO_2$ layer.

In another embodiment of the present invention, the flash memory includes: a Si substrate; a first $SiO_2$ layer formed on the Si substrate; a first high-κ layer formed on the first $SiO_2$ layer; a first HfON layer formed on the first high-κ layer; a first Ge/oxynitride layer formed on the oxynitride layer; a second high-κ layer formed on the Ge/oxynitride layer; a second $SiO_2$ layer formed on the second high-κ layer; and a gate layer formed on the second $SiO_2$ layer.

The present invention further provides a method of fabricating a flash memory, including: providing a substrate; forming a first $SiO_2$ layer on the substrate; forming a first high-κ layer on the first $SiO_2$ layer; forming a metal-implanted oxynitride layer on the first high-κ layer; forming a second high-κ layer on the metal-implanted oxynitride layer; forming a second $SiO_2$ layer on the second high-κ layer; and forming a TaN layer on the second $SiO_2$ layer.

In an embodiment, the As-implanted ZrON is formed by implanting ZrON with As at 60°-tilted angle, 3 KeV and $5\times10^{15}$ $cm^{-2}$ dose, and followed by 950° C. RTA.

BRIEF DESCRIPTION OF DRAWINGS

The invention can be more fully understood by reading the following detailed description of the preferred embodiments, with reference made to the accompanying drawings, wherein:

FIGS. 14(a) and (b) are a schematic structure and s schematic energy band diagram of a Ge/HfON CTF memory of an embodiment according to the present invention, respectively;

FIGS. 15(a) and (b) show program and erase characteristics of HfON CTF memory with and without Ge for different voltages and times; and FIGS. 16(a) and (b) show retention characteristics of a flash memory and cycling characteristics of HfON CTF memory with and without Ge.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

High performance MONOS CTF with highly scaled 3.6 nm ENT is reached and meets ITRS scaling target for the first time. At 125° C. and ±16 V program/erase (P/E), the device has fast 100 μs speed and large extrapolated 10-year retention of 3.1 V. The excellent results were reached using metallic Arsenic (As) implant into higher κ ZrON (κ=35) as trapping layer. In contrast, small 10-year retention window of 1.9 V is found in control ZrON CTF. The improved memory window is due to the better electron trapping capability of $As^+$-implanted ZrON. The excellent $10^6$ cycles and good 125° C. retention may be ascribed to the deep $E_{vac}-E_C$ ZrON and 5.1 eV work-function ($\Phi_m$) of metallic As, to minimize the Schottky emission and tunnel leakage. The excellent $10^6$ cycles are vitally important to allow further endurance improvement in highly scaled CTF device with fewer electrons. These results compare well with other reported data listed in Table 1, with the smallest 3.6 nm ENT, fast 100 μs speed, large memory window, good retention at 125° C. and the best $10^6$ endurance.

TABLE 1

| | P/E conditions for retention & cycling | Initial $\Delta V_{th}$ (V) | $\Delta V_{th}$ (V) for 10-year retention @85° C. | $\Delta V_{th}$ (V) for 10-year retention @125° C. | $\Delta V_{th}$ (V) @Cycles |
|---|---|---|---|---|---|
| This work (As$^+$-implanted) | 16V 100 μs/−16 V 100 μs | 4.9 | 3.4 | 3.1 | 4.3@$10^6$ |
| This work (control un-implanted) | 16V 100 μs/−16 V 100 μs | 2.9 | 2.1 | 1.9 | — |
| TANOS SiO$_2$/Si$_3$N$_4$/Al$_2$O$_3$/TaN | 13.5 V 100 μs/−13 V 10 ms | 4.4 | 2.07 | — | 4@$10^5$ |
| Tri-gate SiO$_2$/Si$_3$N$_4$/SiO$_2$ | 11.5 V 3 ms/−11.5 V 100 ms | 1.2 | 1.1 (@25° C.) | — | 1.5@$10^4$ |
| FinFET SiO$_2$/Si$_3$N$_4$/SiO$_2$ | 13 V 10 μs/−12 V 1 ms | 4.5 | 2.4 | — | 3.5@$10^4$ |
| SiO$_2$/AlGaN/AlLaO$_3$ | 11 V 100 μs/−11 V 100 μs | 3.0 | 1.6 | — | 2.3@$10^5$ |

The TaN—[SiO$_2$—LaAlO$_3$]—ZrON—[LaAlO$_3$—SiO$_2$]—Si CTF device has 2.5 nm thermal SiO$_2$, 2.5 nm LaAlO$_3$, 18 nm ZrON$_{0.2}$, 8 nm LaAlO$_3$, 6 nm LPCVD SiO$_2$, and 200 nm TaN. The LaAlO$_3$, ZrON$_{0.2}$, and TaN were deposited by physical vapor deposition (PVD). To improve the trapping capability, the ZrON was implanted by As at 60°-tilted angle, 3 KeV and 5×10$^{15}$ cm$^{-2}$ dose, followed by 950° C. RTA to reduce the ion-implanted damage. After gate definition, self-aligned As$^+$ implant is applied and RTA is used to activate the dopants. The LaAlO$_3$ was from binary Al$_2$O$_3$ and La$_2$O$_3$, used for $V_t$ tuning in 32 nm gate-first high-κ p- and n-MOSFETs, respectively. For comparison, control CTF device was also fabricated without the As$^+$-implant into ZrON.

Figure 1:
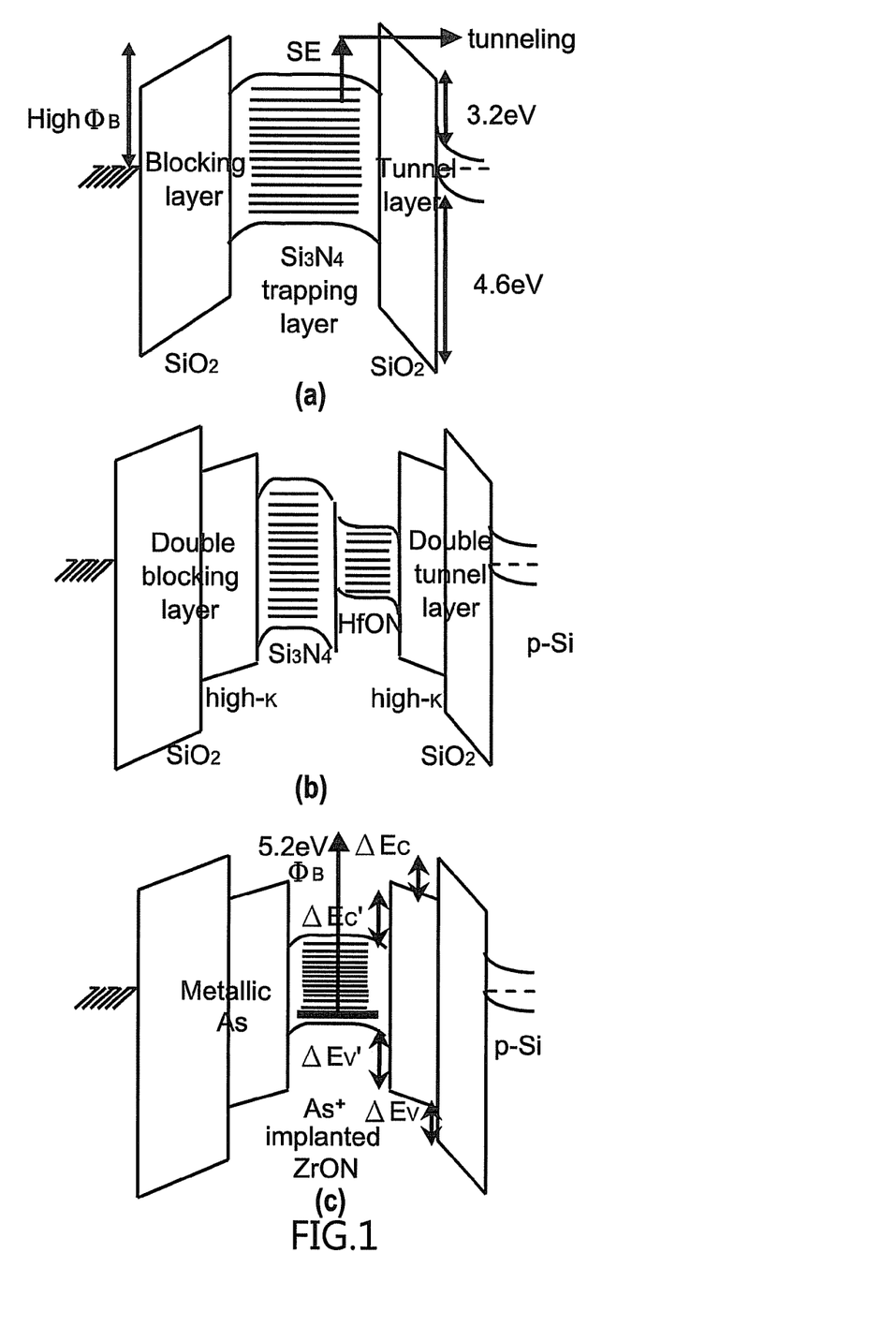
FIGS. 1(a) to (c) are schematic band diagrams of a traditional MONOS CTF, a double $Si_3N_4$—HfON trapping CTF, and a $As^+$-implanted ZrON CTF, respectively.
Figure 2:
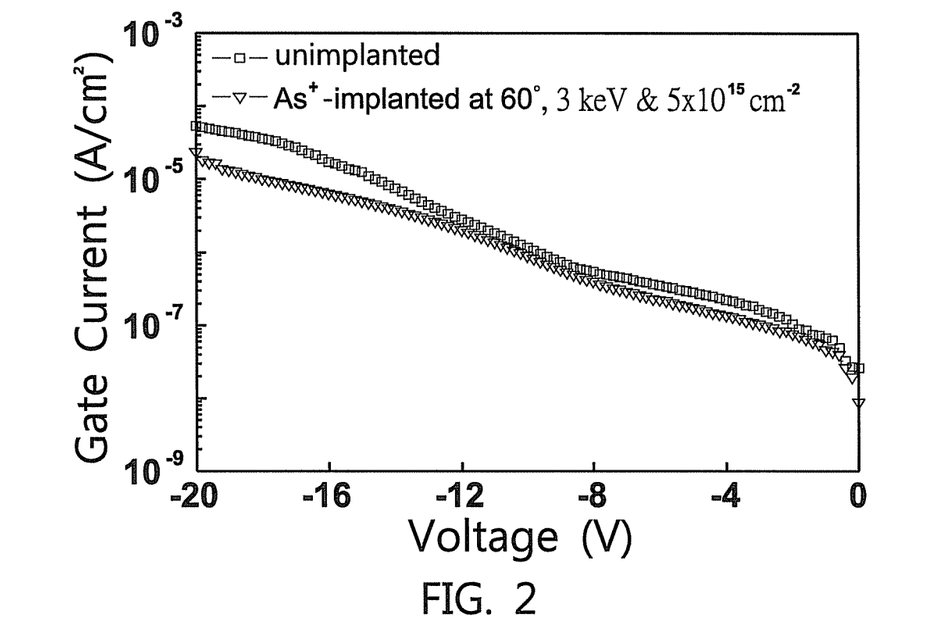
FIG. 2 shows $J_g-V_g$ curves of ZrON MONOS nonvolatile memory (NVM) devices with and without $As^+$-implant.
Figure 3:
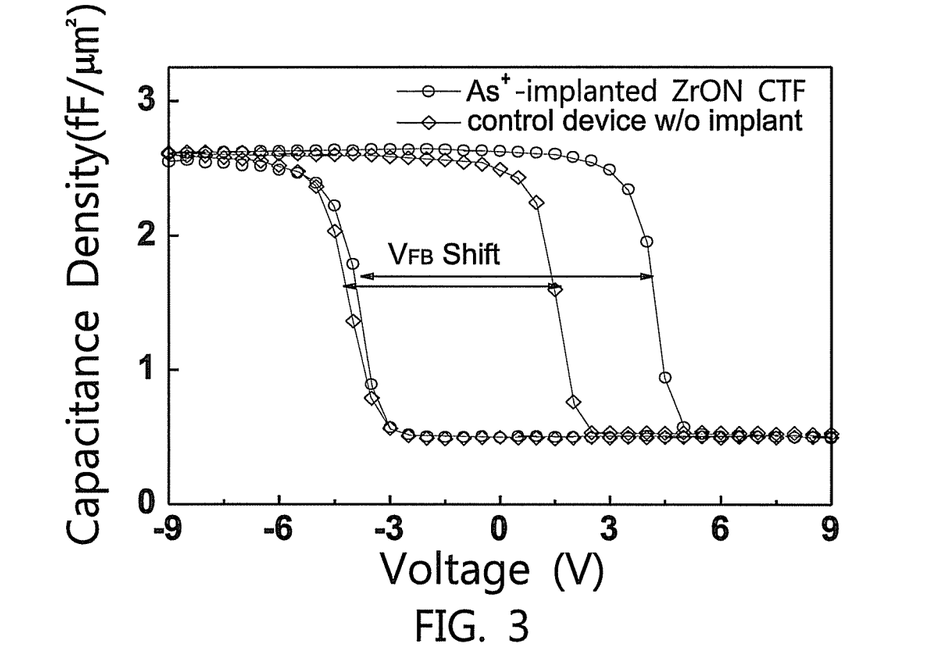
FIG. 3 shows C-V hysteresis of ZrON MONOS NVM devices with and without $As^+$-implant.
Figure 4:
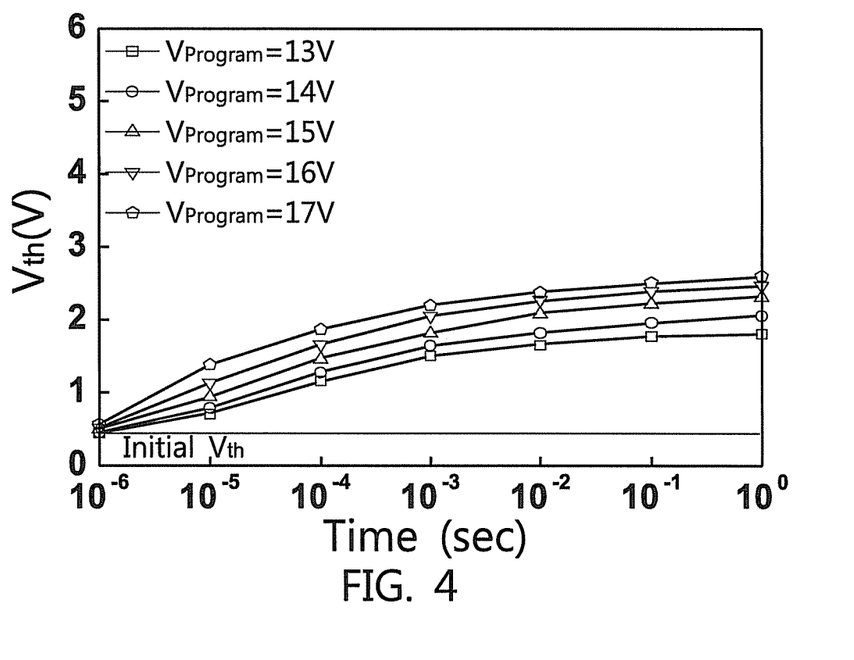
FIG. 4 shows program characteristics of control ZrON MONOS NVM devices for different voltages and times.
Figure 5:
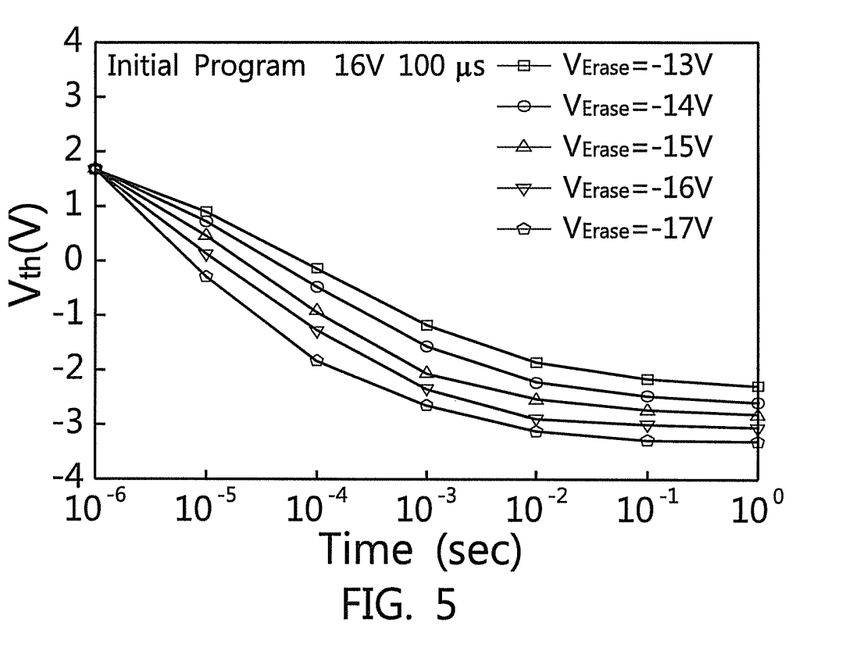
FIG. 5 shows erase characteristics of control ZrON MONOS NVM devices for different voltages and times.
Figure 6:
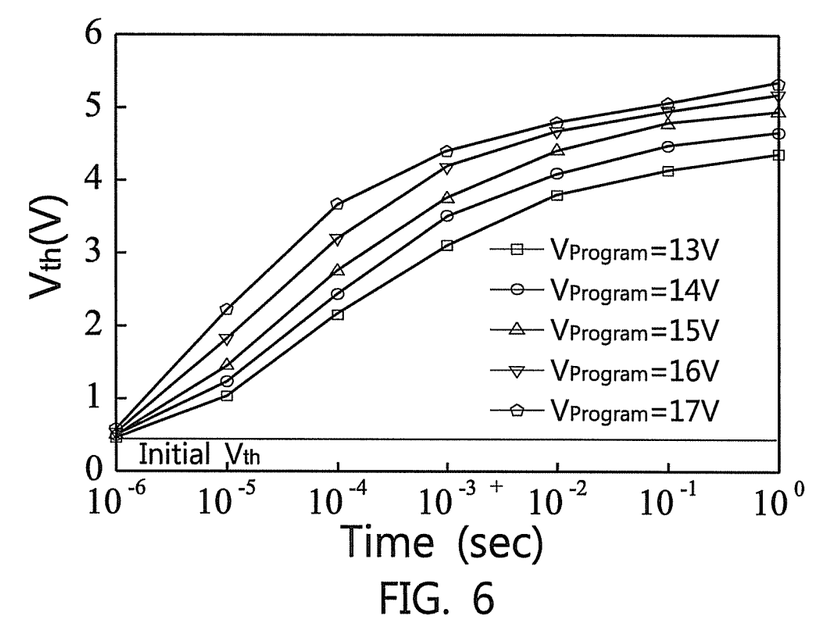
FIG. 6 shows program characteristics of $As^+$-implanted ZrON MONOS NVM devices for different voltages and times.
Figure 7:
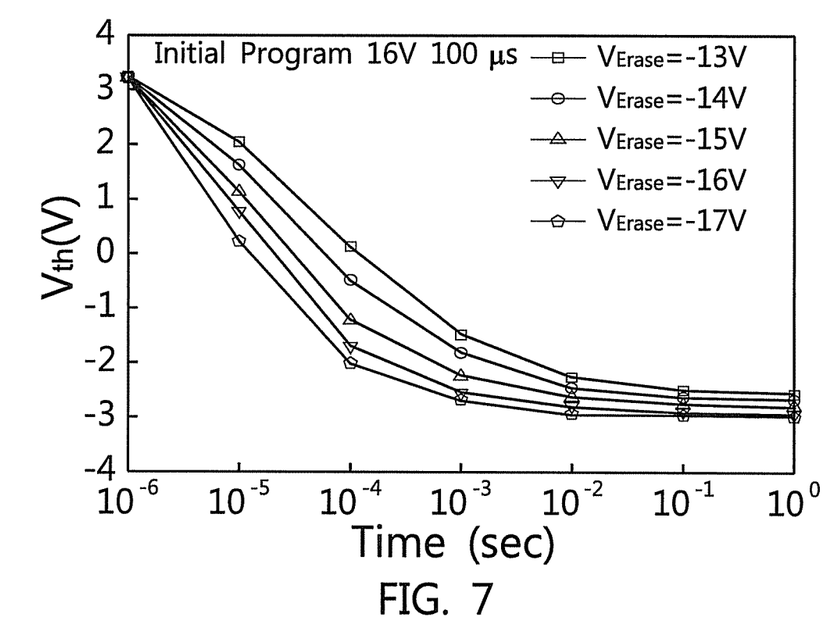
FIG. 7 shows erase characteristics of $As^+$-implanted ZrON MONOS NVM devices for different voltages and times.

A. P/E Characteristics:

FIG. 1 shows the traditional, double trapping Si$_3$N$_4$—HfON, and As$^+$-implanted ZrON MONOS CTF devices. The As$^+$-implanted ZrON has higher κ than HfON and deep $\Phi_m$ of As for trapping. FIG. 2 shows the gate current ($J_g$) of CTF. Close $J_g$ of As$^+$-implanted device with control is reached. Larger C-V hysteresis of 8.1 V was obtained in As$^+$-implanted CTF than control device under ±16 V sweep (FIG. 3). FIGS. 4 and 5 show the program and erase data in control devices. A small $\Delta V_{th}$ memory window of 2.9 V was measured at 100 μs at ±16 V P/E that is typical for metal-oxide-nitride trapping MONOS with low trapping efficiency. The $\Delta V_{th}$ is significantly larger for As$^+$-implanted CTF devices shown in FIGS. 6 and 7, with a large $\Delta V_{th}$ window of 4.9 V at ±16 V 100 μs P/E. This indicates the better trapping efficiency in As$^+$-implanted ZrON that may be due to metallic As atoms and implant-created defects. Since a 950° C. RTA is applied to lower the implanted defects, the As atoms may play a major role for better trapping. The fast 100 μs P/E speed is due to the existing $\Delta E_C$ and $\Delta E_V$ in LaAlO$_3$/SiO$_2$ for easier tunneling, where the larger physical thickness improves the retention with only 3 nm EOT in tunnel oxide.

Figure 8:
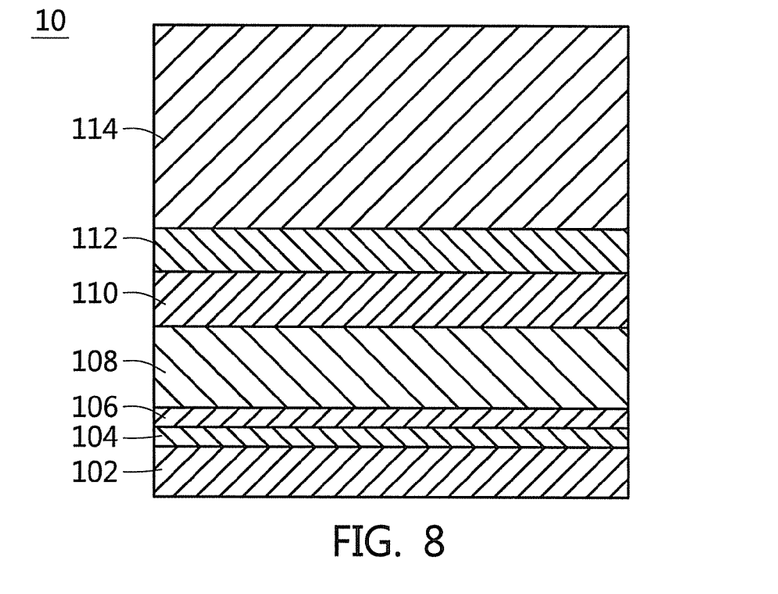
FIG. 8 is a schematic structure of an $As^+$-implanted ZrON/$LaAlO_3$/$SiO_2$/Si of an embodiment according to the present invention.
Figure 9:
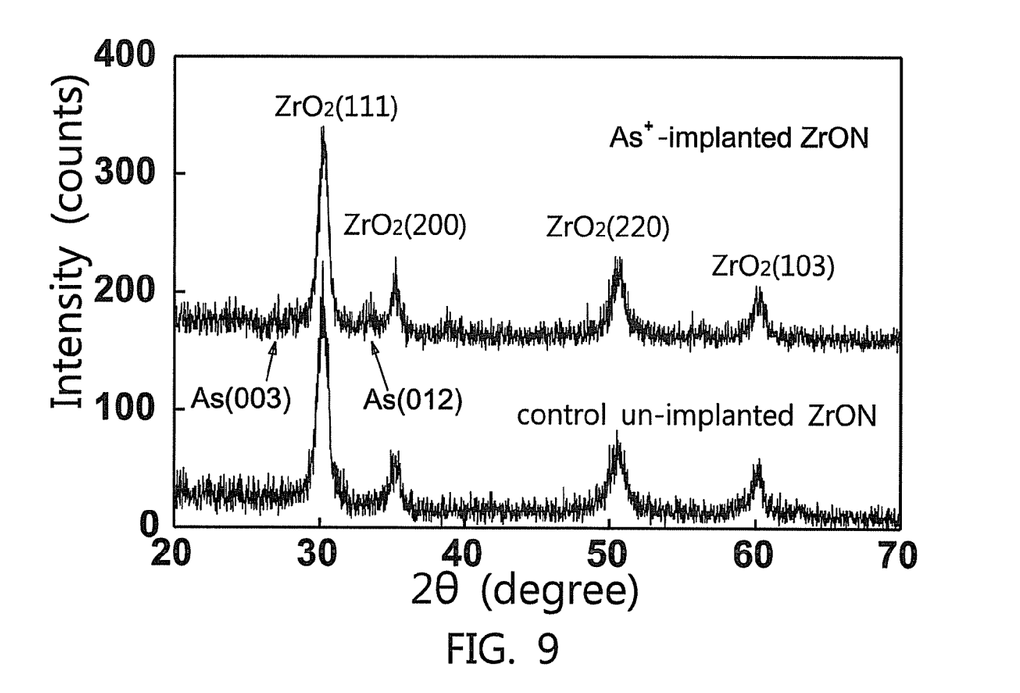
FIG. 9 shows XRD of control and $As^+$-implanted ZrON/$LaAlO_3$/$SiO_2$/Si structure after 950° C. RTA.
Figure 10:
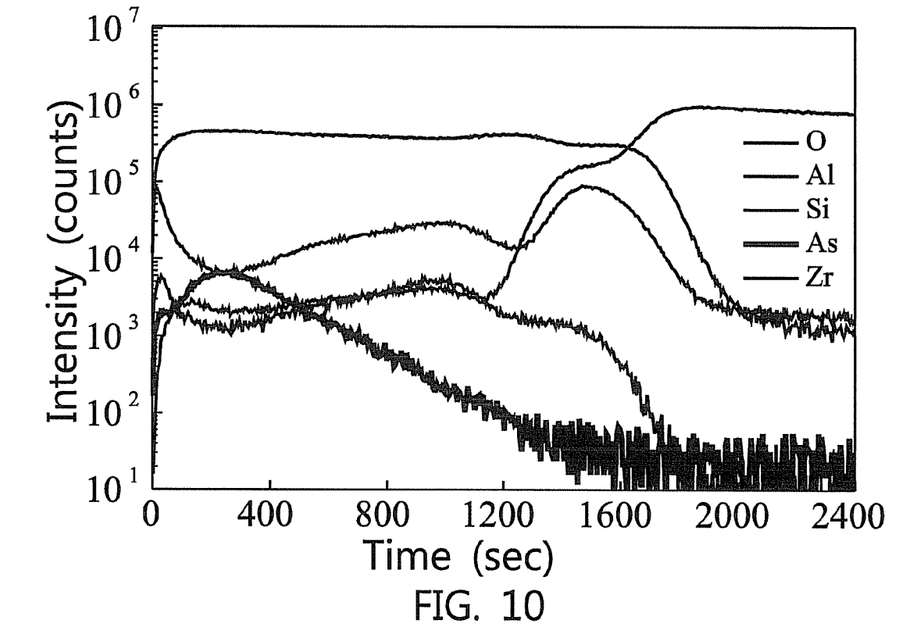
FIG. 10 shows SIMS of the $As^+$-implanted ZrON/$LaAlO_3$/$SiO_2$/Si structure after 950° C. RTA.

B. Characterization of As$^+$-Implanted ZrON:

The As$^+$-implanted ZrON has a schematic structure shown in FIG. 8, which was analyzed by XRD and SIMS shown in FIGS. 9 and 10. As shown in FIG. 8, a flash memory 10 of an embodiment according to the present invention comprises a substrate 102, a SiO$_2$ layer 104 formed on the substrate 102, a LaAlO$_3$ layer 106 formed on the SiO$_2$ layer 104, an As-implanted ZrON layer 108 formed on the LaAlO$_3$ layer 106, another LaAlO$_3$ layer 110 formed on the As-implanted ZrON layer 108, another SiO$_2$ layer 112 formed on the another LaAlO$_3$ layer 110, and a TaN layer 114 formed on the another SiO$_2$ layer 112. In an embodiment, the SiO$_2$ layer 104 is 2.5 nm thick; the LaAlO$_3$ layer 106 is 2.5 nm thick; the As-implanted ZrON layer 108 is 18 nm thick; the another LaAlO$_3$ layer 110 is 8 nm thick; the another SiO$_2$ layer 112 is 6 nm thick; and the TaN layer 114 is 200 nm thick. The ZrON poly-grains are found in X-TEM that gives the higher κ value and smaller ENT. The XRD shows weak As peaks with the same angle of clustered As-dots in As-rich GaAs, which suggests the forming small As metal dots in ZrON although beyond our TEM resolution. Such metallic As with deep 5.1 eV $\Phi_m$ inside ZrON traps may also reduce the Schottky emission and tunnel leakage, in addition to the large $E_{vac}$–$E_C$ of ZrON. From SIMS, the As concentration at 60° 3-keV implant reduces rapidly with thickness and mainly within ZrON that explains the close $J_g$ with control device in FIG. 2.

Figure 11:
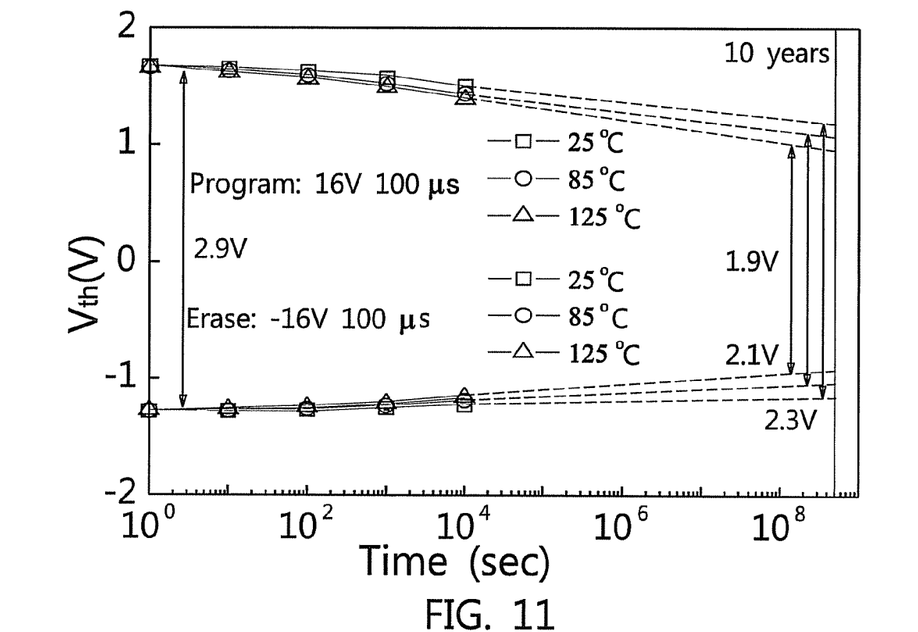
FIG. 11 shows retention characteristics of control un-implanted ZrON MONOS NVM devices at 25-125° C.
Figure 12:
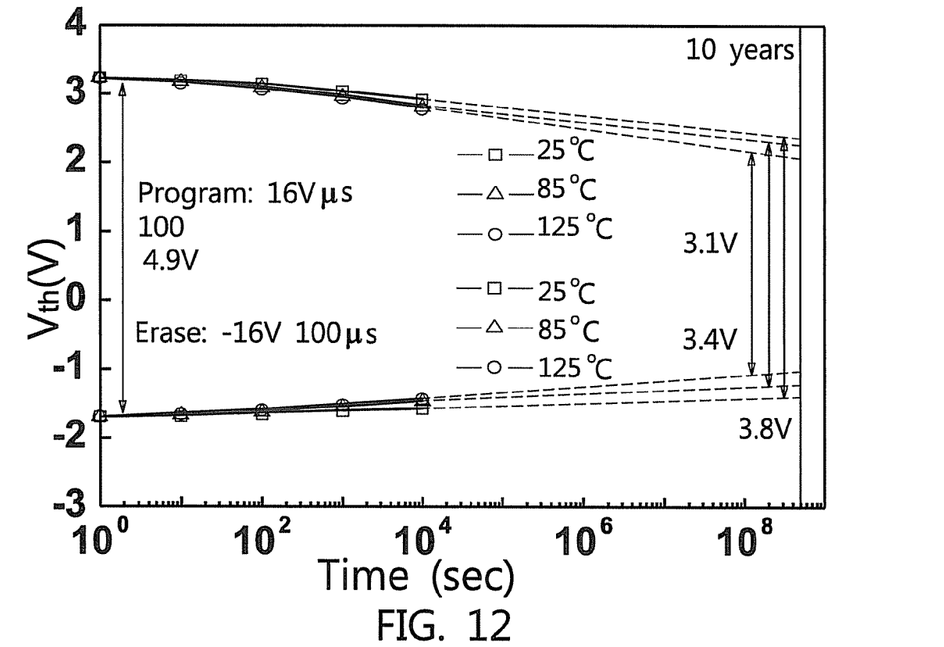
FIG. 12 shows retention characteristics of $As^+$-implanted ZrON MONOS NVM devices at 25-125° C.
Figure 13:
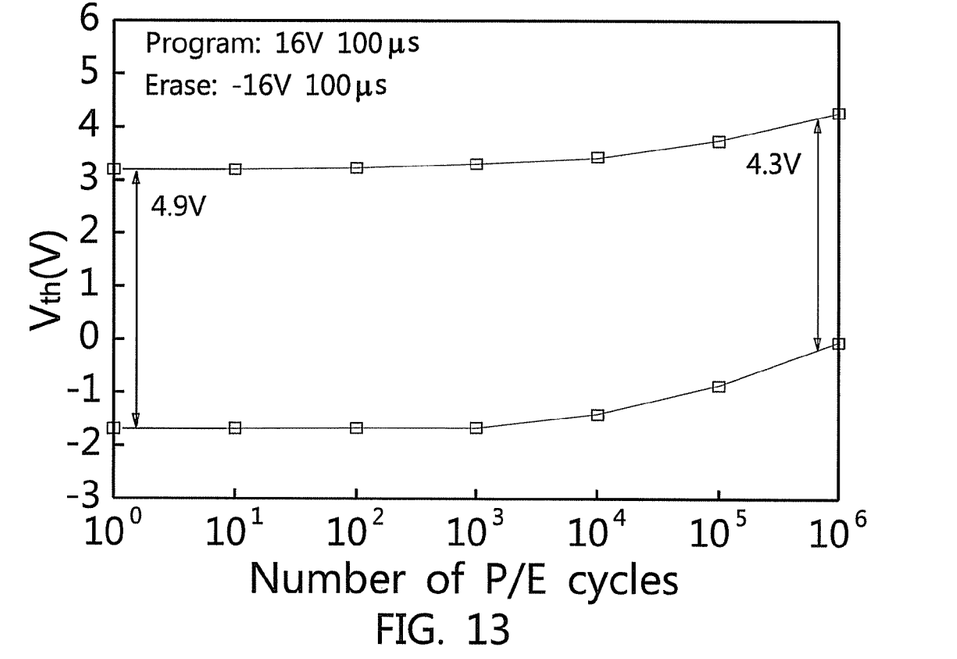
FIG. 13 shows endurance characteristics of $As^+$-implanted ZrON MONOS NVM devices.

C. Retention & Endurance:

FIGS. 11 and 12 show the retention data of As$^+$-implanted and control ZrON CTF devices at 25, 85 and 125° C. A large 10-year extrapolated window of 3.1 V is measured at 125° C. in As$^+$-implanted devices at 100 μs and ±16 V P/E. This is significantly better than the 1.9 V 10-year window in control devices. Such large 10-year retention data allows multi-level cells (MLC) storage even at 125° C. The good retention is due to the extra $\Delta E_C$ confinement energy in LaAlO$_3$/ZrON/LaAlO$_3$ and also deep $\Phi_m$ of metallic As shown in FIG. 1(c), while fast 100 μs erase is also reached from the lowered hole energy barrier $\Delta E_V$ in LaAlO$_3$/SiO$_2$ tunnel oxide. The fast P/E speed and lowered hole tunnel barrier $\Delta E_V$ lead to excellent endurance: as shown in FIG. 13, a still large 4.3 V window is obtained even at $10^6$ P/E cycles. Such excellent cycling data are vitally important and allow further improving the endurance in highly scaled CTF device with fewer stored electrons. Table 1 compares various MONOS CTF devices. The novel device compares well with other devices, with the record thinnest 3.6 nm ENT trapping layer, large memory window, good 125° C. retention, fast 100 μs P/E speed, and the highest $10^6$ endurance.

Using low energy As$^+$-implant into higher κ ZrON trapping layer, this novel CTF device shows excellent device performance of highly scaled 3.6 nm ENT, large 10-year extrapolated retention window of 3.1 V at 125° C. and 1 million times endurance, at a fast 100 μs and low ±16V P/E.

Among various types of NVM, the flash memory has irreplaceable merits of the lowest switching energy and excellent device distribution that are vital for high-density sub-Tb memory arrays. To continue downscale into sub-20-nm, the MONOS CTF devices are proposed to replace the poly-Si floating-gate (FG) flash memory according to ITRS. This is due to the discrete charge-trapping property, simple planar structure, and small cell-cell disturbance that are needed for three-dimensional (3D) flash memory.

One challenge for CTF is the small confinement energy between $Si_3N_4$ trapping layer and $SiO_2$ barrier that degrades the high temperature retention. To address this issue, deep $E_C$ high-κ AlGaN and HfON were used to replace the $Si_3N_4$, which was listed in ITRS for continuous downscaling. In addition, we improved the charge-trapping efficiency at an ENT of 3.6-nm, by using $As^+$-implanted high-κ trapping layer to reach a large 10-year retention window of 3.1 V at 125° C. However, further downscaling the ENT is limited by the ion-implanted damage to tunnel oxide.

In this context, a high performance CTF memory at a record thinnest 2.5-nm ENT trapping layer is disclosed for the first time. This device has a large extrapolated 10-year retention memory window of 3.2 V at 125° C. and excellent endurance of $10^6$ cycles, under fast 100 μs and low ±16 V P/E pulses. These were achieved using Ge reaction with HfON trapping layer to form the HfGeON, even at ultra-thin 2.5-nm ENT. Such excellent device integrity is unreachable for conventional $Si_3N_4$ CTF device due to nearly no trapping at 2-nm $Si_3N_4$.

Experiments

The MoN—[$SiO_2$—$LaAlO_3$]—[Ge—HfON]—[$LaAlO_3$—$SiO_2$]—Si MONOS CTF devices were made on standard 6-in p-type Si wafers. The double tunnel oxide layers of 2.7-nm thick thermal $SiO_2$ was first grown on Si substrates and followed by depositing 2.5-nm thick $LaAlO_3$ by physical vapor deposition (PVD). Then the charge trapping layers of 8-nm thick HfON and 1.5-nm thick Ge were deposited by PVD. Next, a 6.5-nm thick $LaAlO_3$ was deposited by PVD and 6.5-nm thick $SiO_2$ was deposited by chemical vapor deposition (CVD) using Tetraethyl orthosilicate ($Si(C_2H_5O)_4$) to form the double blocking layers. Finally, a 200-nm thick MoN was deposited by PVD, followed by gate definition, reactive ion-etching (RIE), self-aligned 25 KeV $P^+$ implantation at $5\times10^{15}$ $cm^{-2}$ dose and 900° C. RTA to activate the dopant at source-drain region. The CTF devices were with 10-μm gate length, 100-μm width and isolated by field oxide. The fabricated devices were characterized by cross-sectional transmission electron microscopy (TEM), P/E, cycling and retention measurements to 125° C.

Figure 14:
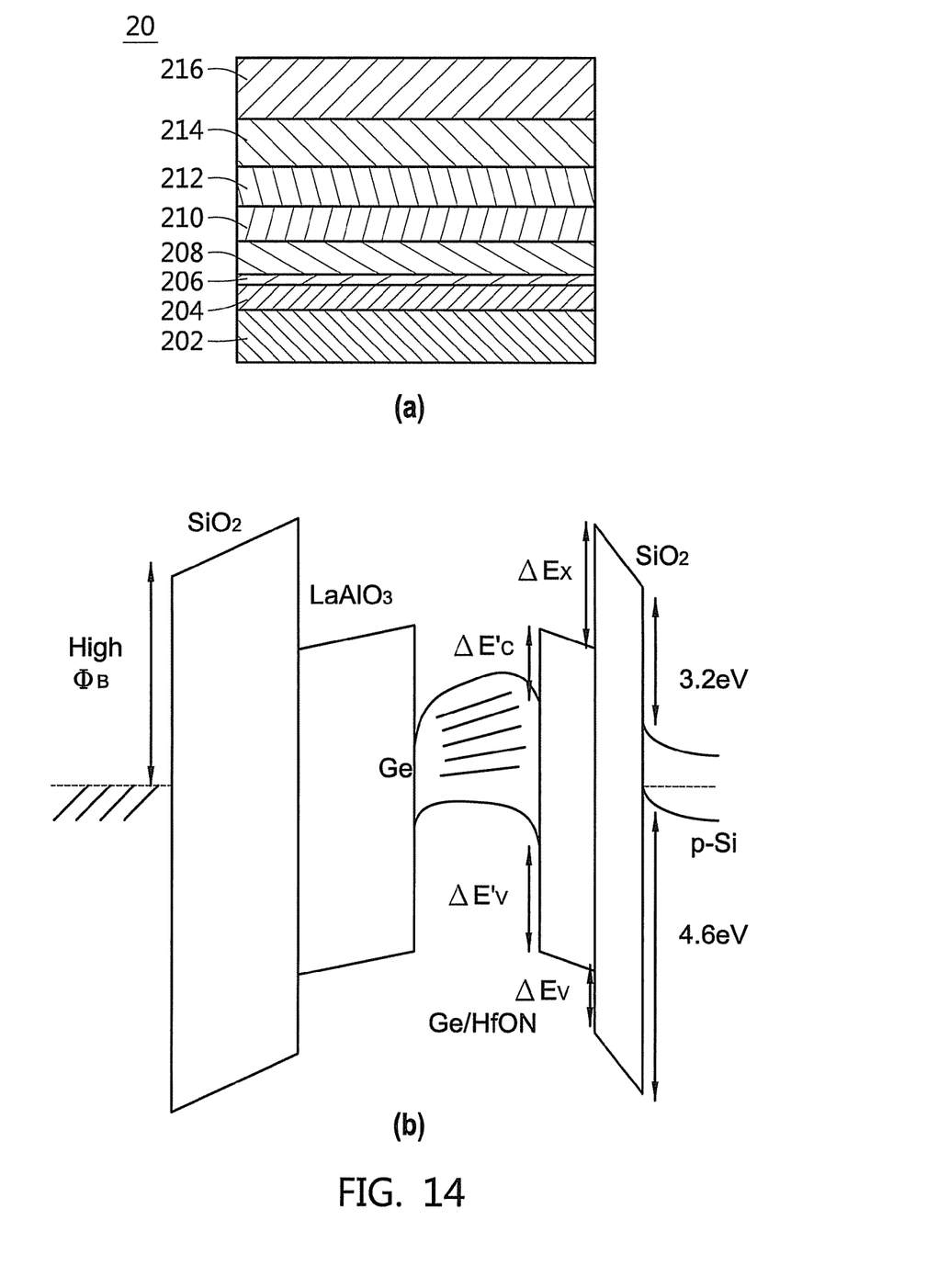

FIGS. 14(a) and (b) show the schematic structure and energy band diagram of the MoN—[$SiO_2$—$LaAlO_3$]—[Ge—HfON]—[$LaAlO_3$—$SiO_2$]—Si CTF device. An ultra-thin ENT of 2.5-nm was obtained from X-TEM. As shown in FIG. 14(a), a flash memory 20 comprises a Si substrate 202, a $SiO_2$ layer 204 formed on the Si substrate 202, a $LaAlO_3$ layer 206 formed on the $SiO_2$ layer 204, a HfON layer 208 formed on the $LaAlO_3$ layer 206, a Ge/HfON layer 210 (that is formed by reacting Ge with HfON) formed on the HfON layer 208, another $LaAlO_3$ layer 212 formed on the Ge/HfON layer 210, another $SiO_2$ layer 214 formed on the another $LaAlO_3$ layer 212, and a MoN layer 216 formed on the another $SiO_2$ layer 214. In an embodiment, the flash memory 20 may further comprise another HfON layer formed on the Ge/HfON layer 210, and another Ge/HfON layer formed on the another HfON layer. The energy band at top Ge/HfON may be narrowed due to the smaller bandgap of Ge (0.67 eV) and HfGeON formation. The small bandgap HfGeON lowers the $E_C$ that improves the carrier retention. The band offset in $LaAlO_3/SiO_2$ double tunnel layers reduces the tunneling barrier for faster P/E speeds and better endurance. The high-κ blocking and trapping layers lower the P/E voltage, which in turn improves the erase saturation due to the higher electric field across the thin tunnel $SiO_2$.

Figure 15:
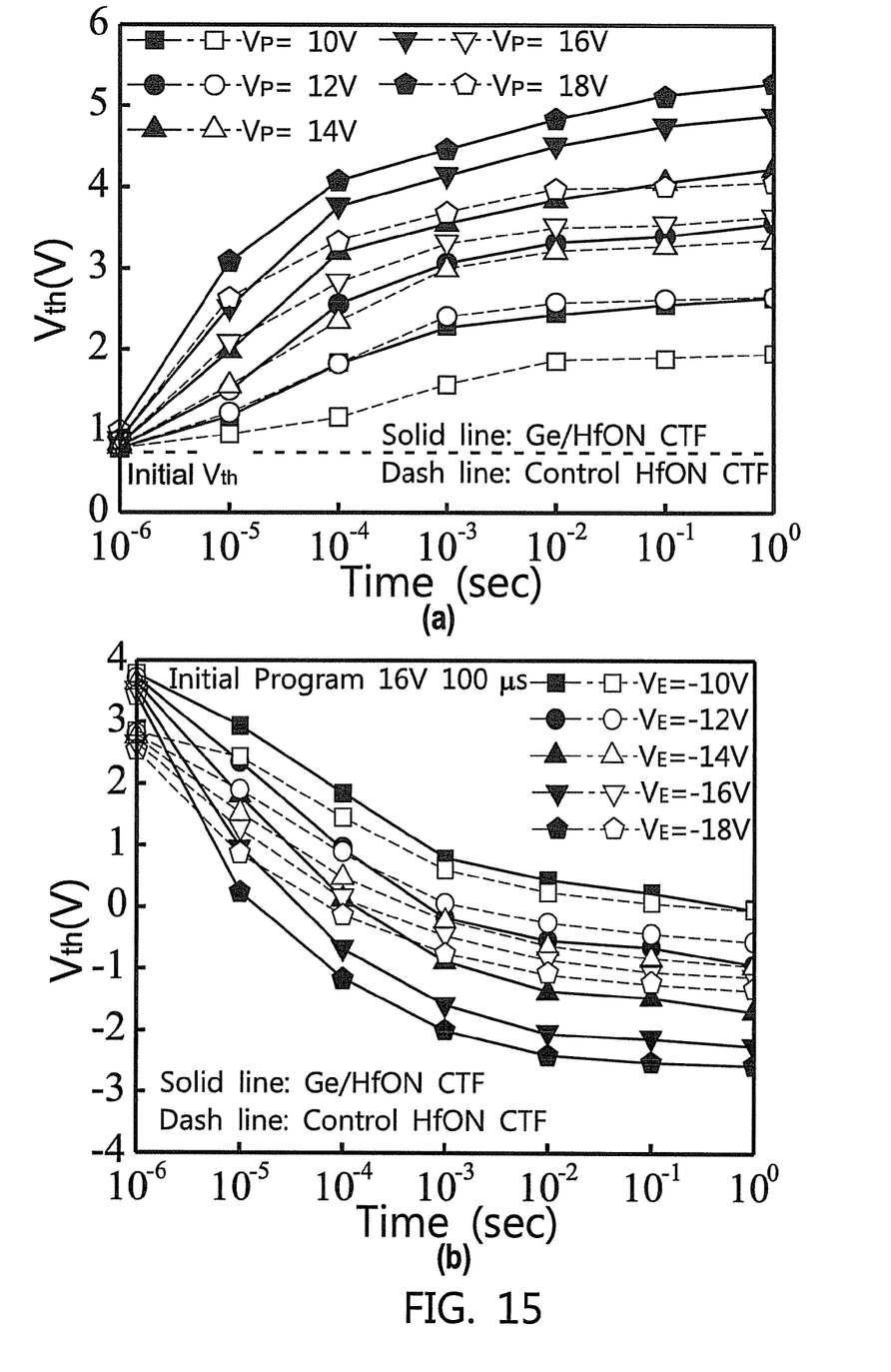

FIGS. 15(a) and (b) show the P/E characteristics of HfON and Ge/HfON CTF, respectively. The $V_{th}$ increases with increasing P/E voltage and time. The larger program $V_{th}$ of Ge/HfON CTF indicates the better trapping capability than that of control HfON device. Small erase saturation was obtained due to the using high-κ dielectrics to give a larger electric field in tunnel $SiO_2$ for better hole tunneling. Under the ±16 V and 100 μs P/E, the $V_{th}$ difference ($\Delta V_{th}$) between P and E are 2.7 V and 4.4 V for HfON and Ge/HfON CTF devices, respectively. The larger $\Delta V_{th}$ memory window of Ge/HfON CTF than control HfON device is due to the Ge reaction with HfON to form the HfGeON that has higher-κ for better erase and higher traps for more efficient charge-trapping.

Figure 16:
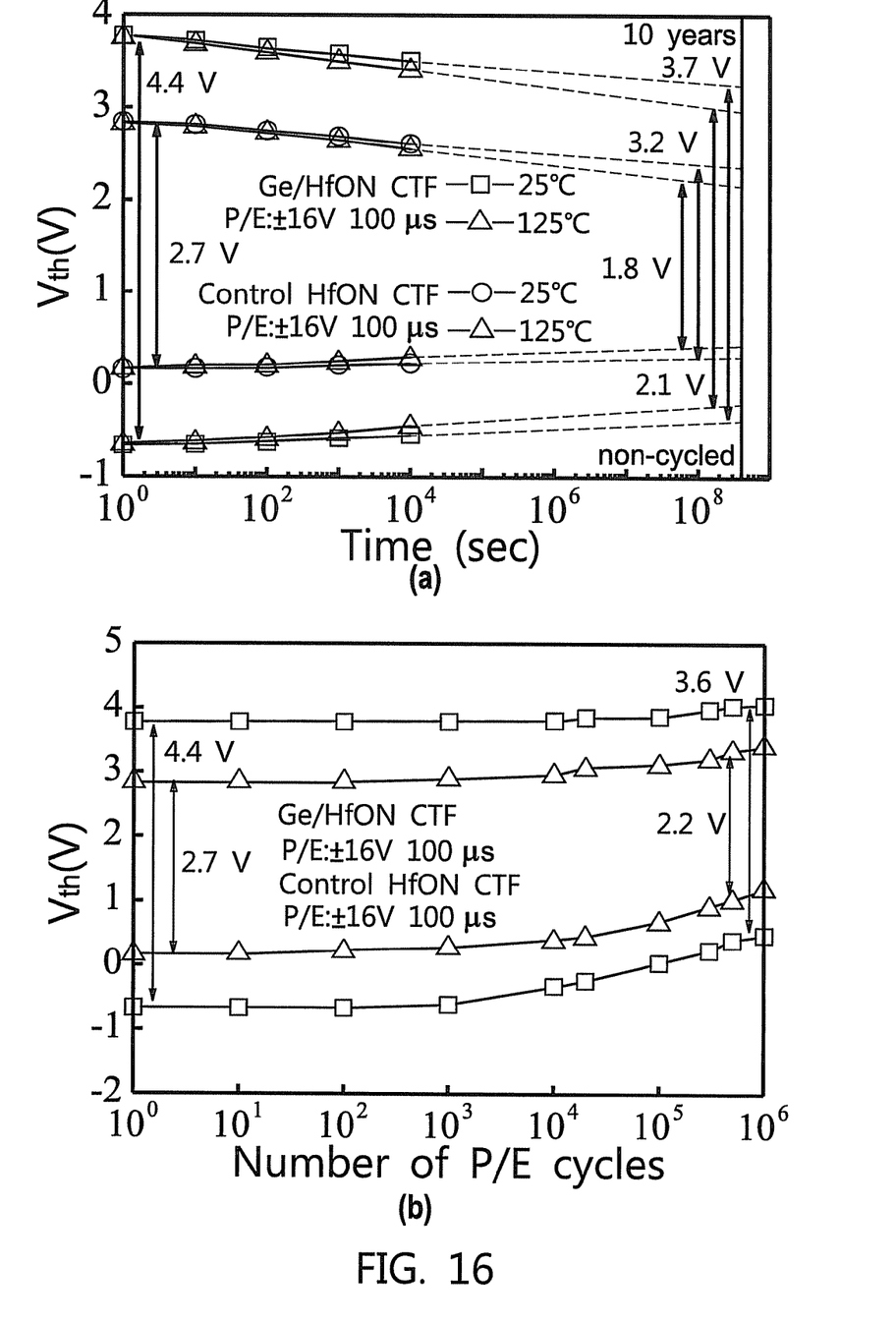

FIG. 16(a) shows the retention characteristics of HfON and Ge/HfON CTF devices. Under the ±16 V and 100 μs P/E, the 10-year extrapolated retention window at 125° C. for HfON CTF is 1.8 V that largely increases to 3.2 V for Ge/HfON device. Such large 10-year retention window allows multi-level cell (MLC) storage at 125° C. with a record thinnest 2.5-nm ENT. The good retention is due to the deep $E_C$ of HfGeON for carrier storage, like the deep-$E_C$ of poly-Si FG flash memory. In addition, the larger physical thickness of high-κ-$LaAlO_3/SiO_2$ double barriers improves the retention. Further, the large energy bandgap and small trap density of $SiO_2$, formed by CVD TEOS, in double barrier also helps the retention improvement. The fast 100 μs erase speed is due to bandgap-engineered lower hole barrier $\Delta E_V$ in the $LaAlO_3/SiO_2$ tunnel oxide. The better trapping capability, faster P/E speed, and lower hole tunnel barrier further lead to excellent endurance as shown in FIG. 16(b), with a larger $10^6$-cycled memory window of 3.6 V than the 2.2 V of control device, at the same ±16 V and 100 μs P/E. Such excellent cycling data are vitally important to allow further endurance improvement in highly scaled CTF device with fewer stored electrons.

The record thinnest 2.5-nm ENT for CTF, large 10-year retention window of 3.2 V at 125° C., and $10^6$ cycled endurance were reached simultaneously under fast 100 μs and low ±16V P/E, which fit the requirements of ITRS shown in Table 2.

Table 2 lists a variety of data published by ITRS in 2009.

TABLE 2

| | NAND Flash poly ½ Pitch (nm) | | | | | |
| --- | --- | --- | --- | --- | --- | --- |
| | 16 | 14 | 13 | 12 | 11 | 9 |
| Cell size 0 area factor a in multiples of $F^2$SLC/MLC | 4.0/1.0 | 4.0/1.0 | 4.0/1.0 | 4.0/1.0 | 4.0/1.0 | 4.0/1.0 |
| Tunnel dielectric | $SiO_2$ or ONO | $SiO_2$ or ONO | $SiO_2$ or ONO | $SiO_2$ or ONO | $SiO_2$ or ONO | $SiO_2$ or ONO |

TABLE 2-continued

| | NAND Flash poly ½ Pitch (nm) | | | | | |
|---|---|---|---|---|---|---|
| | 16 | 14 | 13 | 12 | 11 | 9 |
| material | | | | | | |
| Tunnel dielectric thickness EOT (nm) | 3-4 | 3-4 | 3-4 | 3-4 | 3-4 | 3-4 |
| Blocking dielectric material | $Al_2O_3$ | $Al_2O_3$ | $Al_2O_3$ | $Al_2O_3$ | $Al_2O_3$ | $Al_2O_3$ |
| Blocking dielectric thickness EOT (nm) | 6 | 5 | 5 | 5 | 5 | 5 |
| Charge trapping layer material | SiN/High-K | SiN/High-K | SiN/High-K | SiN/High-K | SiN/High-K | SiN/High-K |
| Charge trapping layer thickness (nm) | 4-6 | 4-6 | 4-6 | 4-6 | 3-4 | 3-4 |
| Gate material | Metal | Metal | Metal | Metal | Metal | Metal |
| Highest W/E voltage (V) | 15-17 | 15-17 | 15-17 | 15-17 | 15-17 | 15-17 |
| Endurance (erase/write cycles) | 1.00E+04 | 1.00E+04 | 1.00E+04 | 1.00E+04 | 1.00E+04 | 1.00E+04 |
| Nonvolatile data retention (years) | 5-10 | 5-10 | 5-10 | 5-10 | 5-10 | 5-10 |
| Maximum number of bits per cell (MLC) | 4 | 4 | 4 | 4 | 4 | 4 |

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A flash memory, comprising:
   a substrate;
   a first $SiO_2$ layer formed on the substrate;
   a first high-κ layer formed on the first $SiO_2$ layer;
   an As-implanted metal oxynitride layer formed on the first high-κ layer;
   a second high-κ layer formed on the metal-implanted metal oxynitride layer;
   a second $SiO_2$ layer formed on the second high-κ layer; and
   a gate layer formed on the second $SiO_2$ layer.

2. The flash memory of claim 1, wherein the high-κ layer is made of a first material of $Al_2O_3$, $La_2O_3$, $HfO_2$, $ZrO_2$, $TiO_2$ or SiN or a ternary or quarternary combination of the first material, the metal oxynitride layer is made of a second material of AlON, LaON, HfON, ZrON, TiON or SiON or a quarternary combination of the second material.

3. The flash memory of claim 1, wherein the gate layer is made of metal or metal-nitride.

4. The flash memory of claim 3, wherein the metal-nitride is TiN, TaN or MoN.

5. A flash memory, comprising:
   a Si substrate;
   a first $SiO_2$ layer formed on the Si substrate;
   a first high-κ layer formed on the first $SiO_2$ layer;
   a first oxynitride layer formed on the first high-κ layer;
   a layer of oxynitride formed on the first oxynitride layer, wherein the oxynitride has a first metal and a second metal, and the first metal is hafnium;
   a second high-κ layer formed on the layer of oxynitride;
   a second $SiO_2$ layer formed on the second high-κ layer; and
   a gate layer formed on the second $SiO_2$ layer.

6. The flash memory of claim 5, further comprising:
   a second oxynitride layer formed on the layer of oxynitride; and
   a layer of oxynitride having a third metal formed on the second oxynitride layer,
   wherein the second high-κ layer is directly formed on the layer of oxynitride having the third metal.

7. The flash memory of claim 6, wherein the high-κ layer is made of a first material of $Al_2O_3$, $La_2O_3$, $HfO_2$, $ZrO_2$, $TiO_2$ or SiN or a ternary or quarternary combination of the first material, the second metal oxynitride layer is made of a second material of AlON, LaON, HfON, ZrON, TiON or SiON or a quarternary combination of the second material, the first metal is As, Sb, Ga, or In, and the third metal is As, Sb, Ga, or In.

8. The flash memory of claim 5, wherein the gate layer is made of metal or metal-nitride.

9. The flash memory of claim 8, wherein the metal-nitride is TiN, TaN or MoN.

10. The flash memory claim 1, wherein the As-implanted metal oxynitride layer is an As-implanted HfON layer.

11. The flash memory of claim 5, wherein the layer of oxynitride having the first metal and the second metal is a HfGeON layer.

* * * * *